United States Patent [19]
U

[11] 3,926,695
[45] Dec. 16, 1975

[54] ETCHED SILICON WASHED EMITTER PROCESS

[75] Inventor: Aung San U, Rangoon, Burma

[73] Assignee: International Telephone and Telegraph Corporation, Nutley, N.J.

[22] Filed: Dec. 27, 1974

[21] Appl. No.: 537,045

[52] U.S. Cl. ...................... 148/187; 29/571; 29/578
[51] Int. Cl.$^{2}$ ........................................ H01L 21/223
[58] Field of Search ............... 148/187; 29/571, 578

[56] References Cited

UNITED STATES PATENTS

| | | | |
|---|---|---|---|
| 3,672,983 | 6/1972 | Witt et al. | 148/187 X |
| 3,675,313 | 7/1972 | Driver et al. | 29/571 |
| 3,676,230 | 7/1972 | Rice | 148/187 |
| 3,678,573 | 7/1972 | Driver | 29/571 |
| 3,765,961 | 10/1973 | Mar | 148/187 X |

*Primary Examiner*—L. Dewayne Rutledge
*Assistant Examiner*—J. M. Davis
*Attorney, Agent, or Firm*—John T. O'Halloran; Menotti J. Lombardi, Jr.; Vincent Ingrassia

[57] ABSTRACT

This relates to a shallow diffused washed emitter process. Prior to diffusion of an emitter into the base region of an active element, a portion of the surface base region is etched away. During this process, lateral etch occurs and extends beneath a portion of the oxide mask. During subsequent diffusion of the emitter, greater lateral diffusion occurs immediately beneath the oxide layer. Deposition of a metal contact causes a closed loop cavity around the periphery of the emitter area to be formed. In this way, the metal contacts only the broadest portion of the emitter region.

8 Claims, 4 Drawing Figures

ETCHED SILICON WASHED EMITTER PROCESS

BACKGROUND OF THE INVENTION

This invention relates to an improved shallow diffused washed emitter process.

In the production of integrated circuit elements, it is common to deposit an epitaxial layer of silicon (for example, n-type) on a silicon substrate (for example, p-type). A buried layer may or may not be formed prior to the deposition of the epitaxial layer. Next, thermally grown oxide of silicon may be deposited on the epitaxial layer and windows opened therein using standard masking and etching techniques through which windows the regions of the active element may be diffused.

In certain applications, it is desirable and often necessary to provide a high package density, for example, in memories containing a large number of storage elements. When this is the case, a relatively thin epitaxial layer is employed requiring shallow diffused base and emitter regions.

The conventional shallow diffused washed emitter process is a very critical process wherein the probability of emitter to base short-circuits or leakages is relatively high. This is generally due to the fact that silicon is soluble in the deposited metal (for example, aluminum) which effectively reduces the depth of the emitter. Any accidental processing inaccuracies only amplify the problem. Since each heating step in the manufacturing process causes some absorption of silicon by the metal contact, limitations naturally arise as to the reworkability of the metal contact when required. Further, the emitter to base breakdown voltage has a large spread due to deviations from the ideally fabricated emitter base junctions.

SUMMARY OF THE INVENTION

It is an object of the present invention to provide a method of producing active elements in a relatively thin epitaxial layer which greatly reduces the possibility of emitter to-base short-circuits and yields an overall more reliable product.

According to a broad aspect of the invention, there is provided a method for providing a shallow diffused emitter region in the base region of an integrated circuit element wherein an epitaxial layer of silicon is deposited on a silicon substrate and wherein base regions of the active elements are diffused into said epitaxial layer, said base regions having disposed thereon a layer of an oxide of silicon having windows therein, exposing a portion of the surface of said base regions such that an emitter region can be diffused into each of said base regions comprising: etching away some of the exposed base region in the intended emitter areas with an etch which does not attack the oxide of silicon, resulting in an underetching of each base region beneath the oxide of silicon layer; diffusing an emitter region into said base region; and depositing a metal contact layer on the surface of said oxide layer and that portion of the already diffused exposed emitter region not beneath the oxide layer such that a closed loop cavity around the periphery of said emitter is produced, said closed loop cavity bounded by said metal contact layer, said oxide of silicon, and said emitter region.

The above and other objects of the present invention will be more clearly understood from the following detailed description taken in conjunction with the accompanying drawing in which:

DESCRIPTION OF THE PREFERRED EMBODIMENT

Figure 1A:
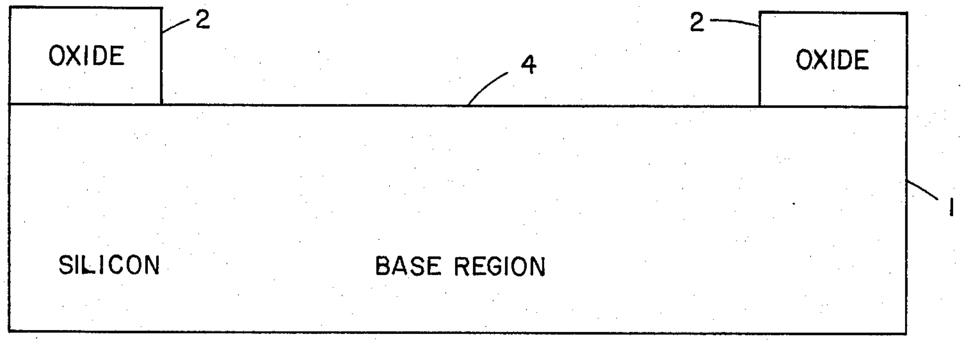
FIGS. 1*a* – 1*d* are illustrative of the various processing steps in the improved shallow diffused washed emitter process.
Figure 1B:
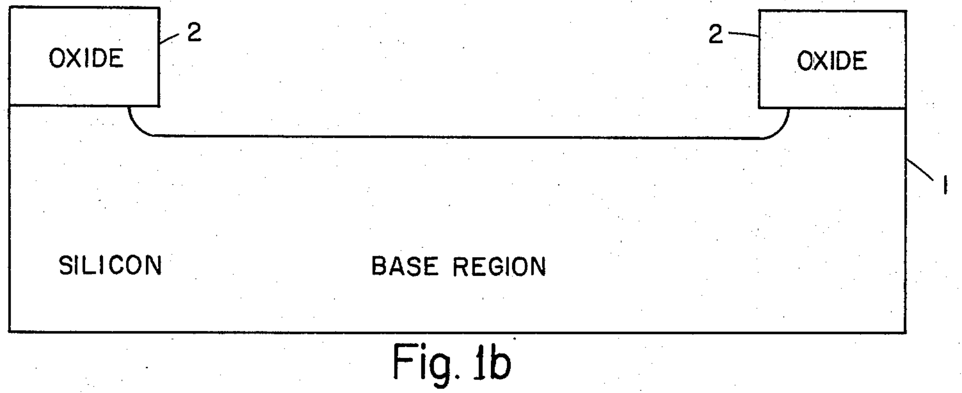

FIG. 1*a* shows a silicon base region 1 having a silicon oxide layer 2 (approximately 3,000 A). A window 3 is formed in the oxide layer 2 exposing a portion of surface area 4 of base region 1. The window 3 is formed using standard photographic and etching techniques well known in the art. Next, some of the silicon exposed in the intended emitter area is etched away to a depth of approximately 10% of the thickness of the intended metal contact layer (approximately 800 A). Any suitable etch may be employed which will yield a polished finish. Since the etch chosen will attack the base region and not attack the oxide layer, a certain amount of underetching beneath the oxide layer occurs. The result is shown in FIG. 1*b*. A wafer containing base region 1 and oxide layer 2 is then recleaned to remove all traces of the silicon etch. This is preferably accomplished through the use of ultrasonic agitation equipment.

Figure 1C:
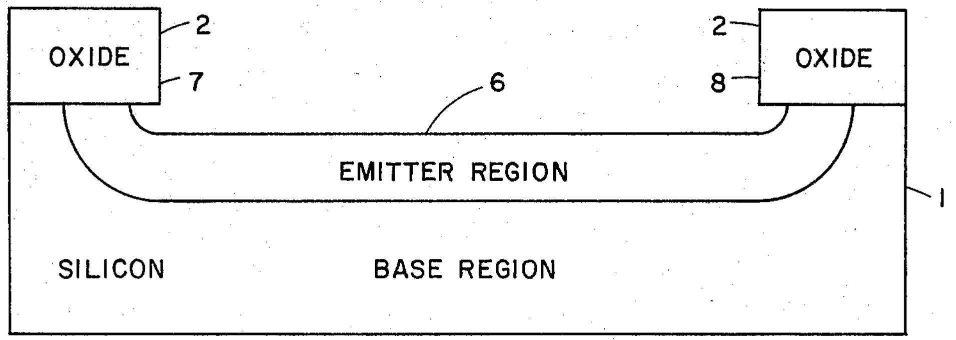

After normal precleaning of the silicon surface, for example with Caro's acid, the emitter region 6 is then diffused to a depth of approximately 2500 A. It should be noted that due to the underetching of the silicon base region beneath the oxide layer, any imperfections in the sides 7 and 8 of the oxide layer is much less likely to interfere with the lateral diffusion of the emitter region beneath the oxide layer resulting in greater lateral diffusion than that which would occur using the conventional washed emitter process wherein the silicon base region is not etched prior to emitter diffusion. FIG. 1*c* illustrates the result of the above described steps.

Figure 1D:
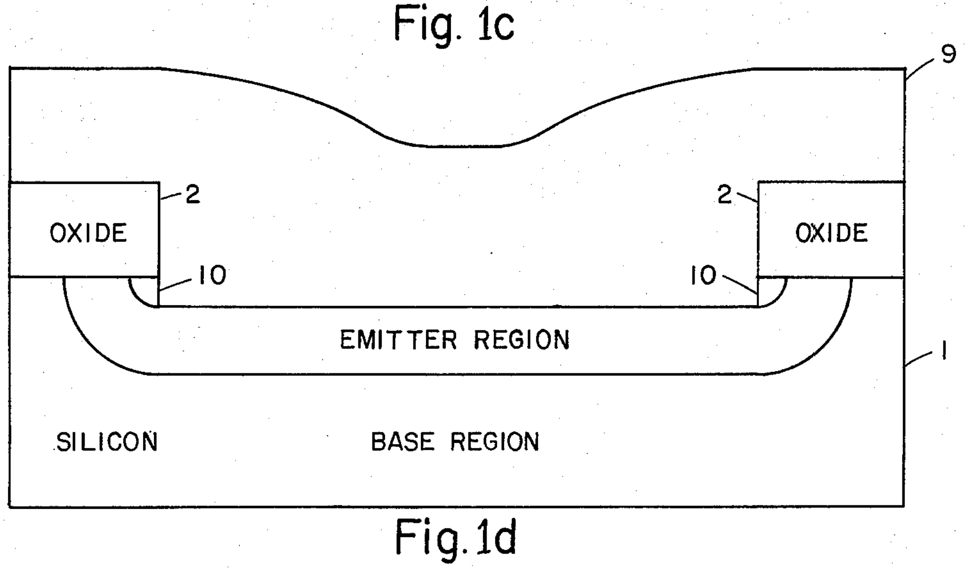

After following normal processing procedures, such as washing with diluted hydrofloric acid to eliminate emitter surface glaze, a metal (aluminum) contact layer is deposited by evaporation on the wafer at a temperature of approximately 200° for aluminum and to a thickness of approximately 8000 A (denoted 9 in FIG. 1*d*). It will be noted from FIG. 1*d* that as a result of underetching beneath the oxide layer and the subsequent metal deposition, a closed loop cavity 10 is formed around the periphery of emitter area 6. The remaining steps, such as those required to produce a protective dielectric layer on a dual metal layer, are standard in the art.

The advantages of the above described process should now be clear. The metal contact layer 9 contacts only the broadest portion of the emitter region. This not only results in a reduction in emitter to base short-circuits and leakages, but also contributes to the reworkability of the metal in the event that the metal contact must be removed and redeposited. Further, this process has yielded a tighter emitter to base breakdown voltage spread, a good testimony of better base emitter junctions.

Variations in the above described process may be required to deal with special requirements of certain devices. The described process is clearly applicable to the production of large scale integration (LSI) devices where several emitters are coupled to each other in a parallel manner and to memory devices where high packaged density is a requirement.

While the principles of the invention have been described above in connection with specific apparatus, it is to be clearly understood that this description is made only by way of example and not as a limitation on the scope of the invention.

What is claimed is:

1. A method for providing a shallow diffused emitter region in the base region of an integrated circuit element, said base region having deposited thereon a masking layer having windows therein for exposing a portion of the surface of said base region such that an emitter region can be diffused into said base region comprising the steps of:

etching away some of the exposed base region in the intended emitter areas resulting in an underetching of said base region beneath the masking layer;

diffusing an emitter region into said base region; and depositing a metal contact layer on the surface of said masking layer and that portion of the diffused exposed emitter region not beneath the masking layer such that a closed loop cavity around the periphery of said emitter is produced, said closed loop cavity bounded by said metal contact layer, said masking layer, and said emitter region.

2. A method according to claim 1 wherein said metal is aluminum.

3. A method according to claim 2 wherein said metal contact layer is deposited by evaporation.

4. A method according to claim 3 wherein the exposed silicon in the emitter area is etched to the depth of approximately 10% of the thickness of said metal contact layer.

5. A method according to claim 4 further including the step of cleaning said exposed base region prior to emitter diffusion through the use of ultrasonic agitation equipment.

6. A method according to claim 5 further including washing the exposed emitter surface with hydrofloric acid prior to deposition of said metal contact layer.

7. A method according to claim 6 wherein said metal contact layer is approximately 800 A in thickness.

8. A method according to claim 7 wherein said emitter region is diffused to a depth of approximately 2500 A.

* * * * *